United States Patent [19]
Chiozzi

[11] Patent Number: 5,917,382
[45] Date of Patent: Jun. 29, 1999

[54] SENSOR OF THE INSTANT POWER DISSIPATED IN A POWER TRANSISTOR

[75] Inventor: Giorgio Chiozzi, Cinisello Balsamo, Italy

[73] Assignee: STMicroelectronics, S.r.l., Agrate Brianza, Italy

[21] Appl. No.: 08/739,328

[22] Filed: Oct. 30, 1996

[30] Foreign Application Priority Data

Oct. 31, 1995 [EP] European Pat. Off. .............. 95830458

[51] Int. Cl.$^6$ ........................................................ H03F 1/52
[52] U.S. Cl. ......................................... 330/298; 330/207 P
[58] Field of Search ................................. 330/207 P, 298; 361/88, 91, 93, 101

[56] References Cited

U.S. PATENT DOCUMENTS 4,355,341  10/1982  Kaplan .................................... 361/79
4,564,879   1/1986  Bienstman ....................... 330/207 P X

FOREIGN PATENT DOCUMENTS 0 058 005 A1  8/1982  European Pat. Off. .......... H03F 1/52
2 214 745     9/1989  United Kingdom ............. H03F 3/45

*Primary Examiner*—James B. Mullins
*Attorney, Agent, or Firm*—David V. Carlson; Seed and Berry LLP

[57] ABSTRACT

A sensor of instantaneous power which is dissipated through a power transistor of the MOS type connected between the output terminal of a power stage and ground. It comprises a MOS transistor having its gate terminal connected to that of the power transistor, source terminal connected to ground, and drain terminal connected to a circuit node which is coupled to the output terminal by means of a current mirror circuit which includes a resistive element in its input leg. Connected to the circuit node is the base terminal of a bipolar transistor which is respectively connected, through a diode and a constant current generator between the output terminal and ground.

49 Claims, 4 Drawing Sheets

SENSOR OF THE INSTANT POWER DISSIPATED IN A POWER TRANSISTOR

CROSS-REFERENCE TO RELATED APPLICATION

This application claims priority from European 95830458.6, filed Oct. 31, 1995, which is hereby incorporated by reference. However, the content of the present application is not necessarily identical to that of the priority application.

BACKGROUND AND SUMMARY OF THE INVENTION

This invention relates to protection devices for power elements included in integrated circuits. More specifically, this invention relates to devices for protecting final power transistors included in integrated circuits against outgoing overcurrents and overvoltages that may originate from shorts, for example.

The protection devices are integrated to the circuit which includes the power element to be protected, and accordingly, it should be possible to fabricate these circuits using simple and economical technologies, without losing power which could restrict the dynamic range of the power element. In addition, such devices should be able to provide a reliable, high degree of protection.

A conventional type of protection device that fulfills these demands has a circuit construction which includes at least one active element thermally coupled to the power element to be protected. This active element is connected to a control circuit which operates to turn off the integrated circuit to which the power element belongs upon the active element sensing a dangerous temperature level, indicative of excessive power being dissipated due to a condition of overvoltage or overcurrent.

This conventional type of protection, while being effective and reliable, is unsuitable where the abnormal conditions of operation are only temporary, since, lacking any external action, the device would remain off anyway.

It is for this reason that protectors are most frequently used. Although protectors are more complicated circuit-wise, their cut-in threshold is tied to the level of electrical quantities, such as current and voltage, that are related to the element to be protected, rather than to the level of heat dissipation. The level of such quantities is regulated to suit the dissipated instantaneous power, without the integrated circuit having to be turned off.

Such protection devices usually include circuit means for sensing and processing the value of the current flowing through the power element and of the voltage across it, to produce, on a given threshold of values being exceeded, the activation of a threshold circuit. Therefore, the current value through the power element is brought down to a maximum value which corresponds to the threshold and is a function of the voltage value across the element.

The maximum value that the current flowing through the power transistor can have without problems, and on which the sizing of the protection circuit would be dependent, is set by the physical characteristics of the same.

In general, for economical reasons, the users of integrated circuits that include power elements would size the external heat sinks for such elements to meet normal operation requirements, since short periods of large heat dissipation are well tolerated.

However, in a condition of protracted shorting, there exists a risk of the integrated circuit being damaged, and the surrounding material overheating and perhaps catching fire, from the heat generated and not adequately dissipated to the outside.

On the other hand, it would not be convenient to have the maximum current level through the power element decreased by lowering the cut-in threshold of the protection, because this would needlessly restrict the dynamic range of the circuit under normal operating conditions.

An example of a protection circuit of the type just outlined, for a power element in an integrated circuit, is disclosed in U.S. Pat. No. 4,623,950 assigned to this Applicant and hereby incorporated by reference.

Since power transistors fail when their working point moves out of their Safe Operating Area (SOA), which is largely limited by the maximum power which can be dissipated, it is important to be able to accurately measure the instantaneous power being dissipated by the transistors, in order to ensure proper operation of the transistors and best utilization of their potential for dissipation. It is vitally important that this measurement be dependent on the smallest possible number of process parameters, and independent of temperature. The sensing circuit employed heretofore actually provides coarse power measurements. In fact, such circuits usually are affected by temperature and several process parameters, and also disallow full exploitation of the power transistors. A simple circuit, whose design allows for utmost reproducibility and least use of silicon area is also of importance.

The present invention provides a sensing circuit (or sensor) for sensing the instantaneous power which can be dissipated through a power transistor in an integrated circuit, while having a simple construction, using a minimal amount of integration area, and affording improved measuring accuracy over conventional sensing circuits, so that full use of the transistor dynamic range can be made.

A preferred embodiment of the present invention includes a sensing circuit for instantaneous power which is dissipated, as indicated above, which includes a power transistor of the MOS type connected between the output terminal of a power stage and ground. It further comprises a MOS transistor having its gate terminal connected to that of the power transistor, its source terminal connected to ground, and its drain terminal connected to a circuit node. This circuit node is coupled to the output terminal by means of a current mirror circuit, which includes a resistive element in its input leg. Connected to the circuit node is the base terminal of a bipolar transistor which is respectively connected, through a diode and a constant current generator, between the output terminal and ground.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
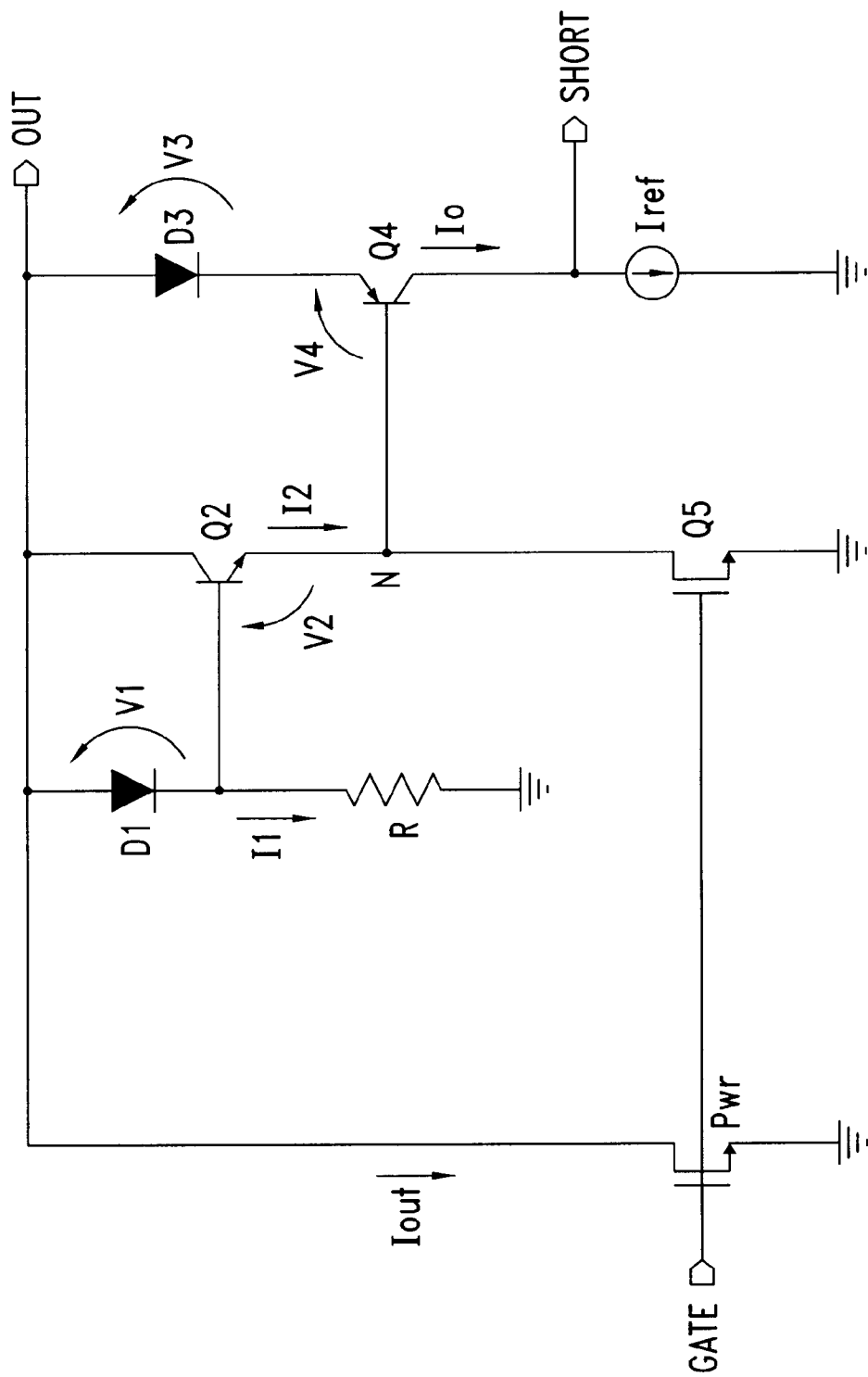
FIG. 1 shows a circuit diagram of an instantaneous power sensor for a power transistor.
Figure 4:
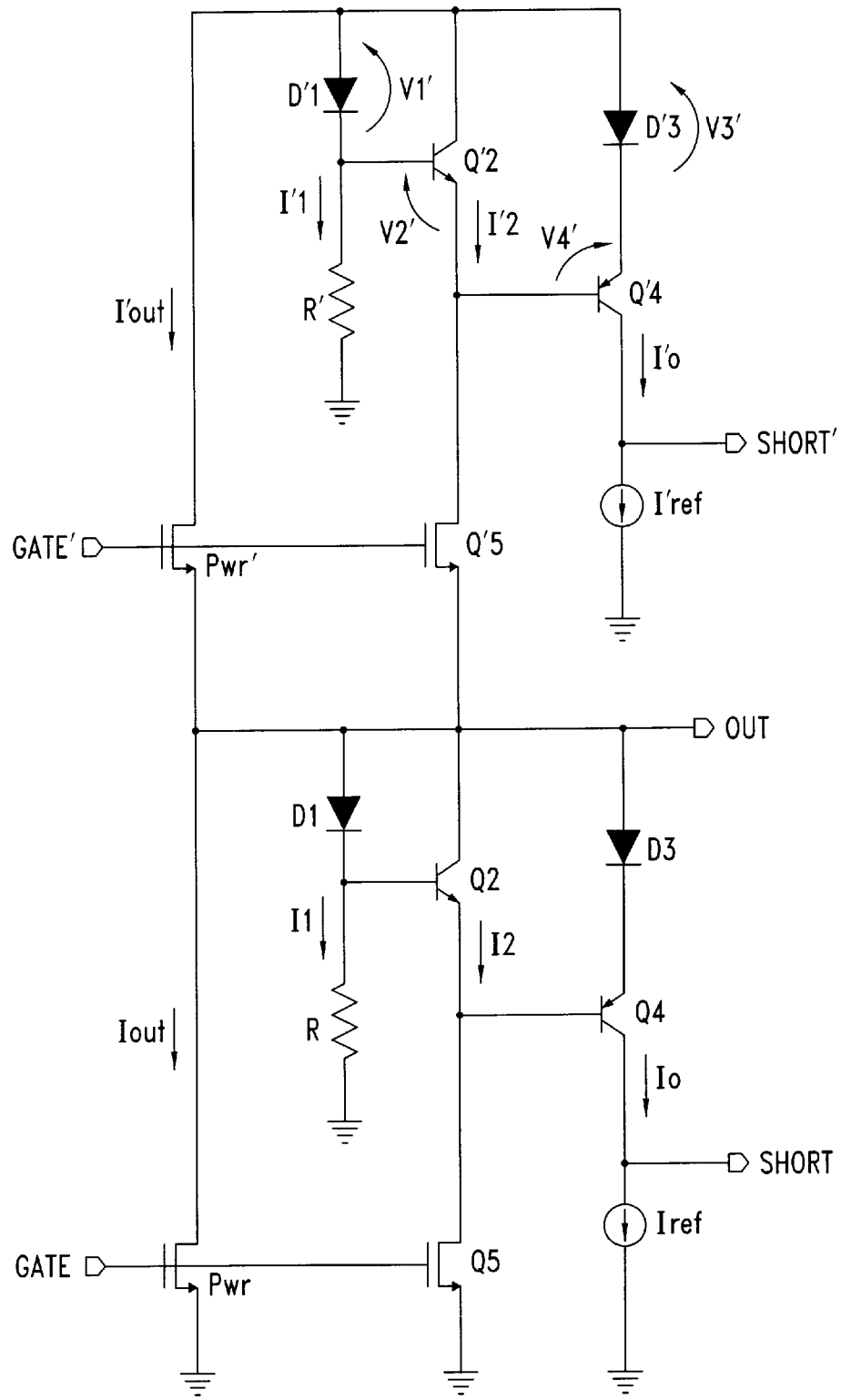
FIG. 4 illustrates a possible application of a pair of sensors to a power final stage of the push-pull type.

The numerous innovative teachings of the present application will be described with particular reference to the presently preferred embodiment (by way of example, and not of limitation), in which:

Shown in FIG. 1 is a circuit diagram of a sensor according to one embodiment of the invention adapted to sense the instantaneous power which is dissipated through a power transistor, in this case a power transistor Pwr of the N-channel MOS type, as commonly used in the lower half-stage of a push-pull power final stage (FIG. 4).

A typical application for such a sensor includes audio power amplifiers arranged for driving loudspeakers.

The power transistor Pwr is connected by its drain and source terminals, respectively, between the output terminal OUT of the stage and ground.

Omitted from the simplified diagram of FIG. 1, are control and bias circuit means which may be those normally used by those skilled in the art. The information about the instantaneous power being dissipated by the power transistor is supplied through the output terminal SHORT of the sensor. Such information can be conventionally processed by such control and bias circuit means to protect the power element in all situations, without needlessly restricting its dynamic range.

The sensing circuit comprises a bipolar transistor Q4 of the PNP type which has its emitter terminal coupled to the output terminal OUT of the stage through a diode D3, and its collector terminal coupled to ground through a reference current generator Iref.

The output terminal SHORT of the sensor is connected to a circuit node between the transistor Q4 and the current generator Iref.

Connected to the output terminal of the stage is a current mirror circuit, of which a first leg includes a diode D1 and a resistor R and is connected between the terminal OUT and ground, while the second leg includes a bipolar transistor Q2 of the NPN type which is connected by its collector and emitter terminals, respectively, between the terminal OUT and a circuit node N to which the base terminal of the transistor Q4 is connected.

Preferably, the sensor further comprises a transistor Q5 which, as shown in FIG. 1, is of the N-channel MOS type, like the power transistor, and is driven (in this case through a common terminal GATE) in the same manner as the power transistor. The transistor Q5 has its source and drain terminals respectively connected to ground and to the circuit node N.

The same gate voltage is applied to the transistors Pwr and Q5, and they can be operated in the same conditions of bias. Furthermore, the transistor Q5 can be much smaller than the power transistor. For example, the ratio between the sizes of transistors Pwr and Q5 can be as high as 1000:1 respectively. In addition, the transistor Q5 can be integrated in tight thermal connection to the power transistor, or even inside the power transistor.

The voltage drop across the diode D1 is $$V_1 = V_t \ln\left[\frac{I_1 + \frac{I_2}{\beta}}{I_{s1}}\right] \quad (1)$$

and that across the base-emitter junction of Q2 is:

$$V_2 = V_t \ln \frac{I_2}{I_{s2}} \quad (2)$$

while the collector current of Q4 is:

$$I_O = I_{s4}\exp\frac{V_4}{V_t} = I_{s3}\exp\frac{V_3}{V_t} \quad (3)$$

The voltage V3 across D3 can be obtained from (3) above, by equating the logarithms of the second and third terms and solving for V3, thus:

$$V_3 = \frac{V_t}{2}\ln\left[\frac{I_{s4}\left(I_1 I_2 + \frac{I_2^2}{\beta}\right)}{I_{s1} I_{s2} I_{s3}}\right] \quad (4)$$

Substituting the expression (4) in (3), the following expression for the output current is obtained:

$$I_O = \sqrt{\frac{I_{s3} I_{s4}}{I_{s1} I_{s2}}} \sqrt{I_1 I_2 + \frac{I_2^2}{\beta}} \quad (5)$$

It can be seen that the current flowing through the transistor Q5 "mirrors" the current passed from the power transistor Pwr, and that I1 is proportional to the drain-source voltage:

$$I_1 = \frac{V_{ds} - V_{be}}{R} ; \quad I_2 = \frac{\left(\frac{W}{L}\right)_5}{\left(\frac{W}{L}\right)_{pwr}} I_{out} \quad (6)$$

Taking equation (6), and because the dissipated instantaneous power is Pdiss=IoutVds, (5) can be re-written as follows:

$$I_O = \sqrt{\frac{I_{s3} I_{s4}}{I_{s1} I_{s2}}\frac{1}{R}\frac{\left(\frac{W}{L}\right)_5}{\left(\frac{W}{L}\right)_{pwr}}} \sqrt{P_{diss}\left(1 - \frac{V_{be}}{V_{ds}}\right) + \frac{P_{diss}^2}{V_{out}^2}\frac{R}{\beta}\frac{\left(\frac{W}{L}\right)_5}{\left(\frac{W}{L}\right)_{pwr}}} \quad (7)$$

The last term under the root line in (7) takes account of the contribution from the base current of Q2 which, however, is trivial. Thus (7) becomes, as a coarse approximation:

$$I_O = \sqrt{\frac{I_{s3} I_{s4}}{I_{s1} I_{s2}}\frac{1}{R}\frac{\left(\frac{W}{L}\right)_5}{\left(\frac{W}{L}\right)_{pwr}}} \sqrt{P_{diss}\left(1 - \frac{V_{be}}{V_{ds}}\right)} = \quad (8)$$

$$K\sqrt{P_{diss}\left(1 - \frac{V_{be}}{V_{ds}}\right)} \cong K\sqrt{P_{diss}}$$

It has been shown that, if the base current of Q2 and the voltage drop across the diode D1 are neglected, the outgoing current from the collector of the transistor Q4 is proportional to the square root of the power dissipated through the power transistor. With the maximum power which can be dissipated being known, (8) gives the value setting for the reference current generator Iref.

Figure 2:
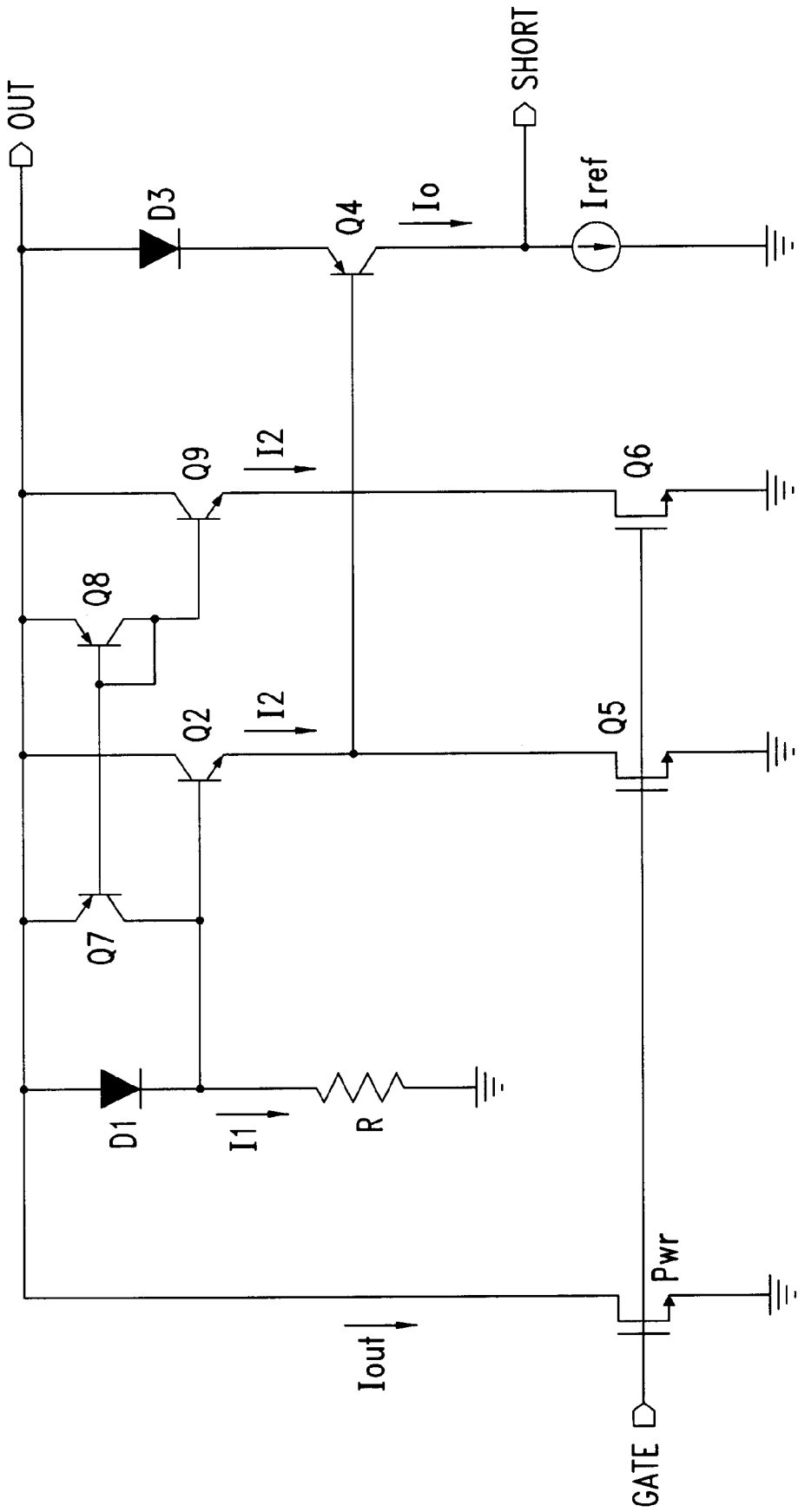
FIGS. 2 and 3 illustrate further improvements on the circuit diagram of FIG. 1.

Were the contribution from the base current of Q2 a significant one (as may happen especially at low values of Vds and if the (W/L)Q5/(W/L)Pwr ratio is too high), it is possible to recover it as shown in FIG. 2. Transistor Q6 must be identical with Q5, so as to generate the same current I2. The current mirror formed of Q7 and Q8 recovers the base current of Q9, which is the same as that of Q2. In fact, Q2 and Q9 should have the same dimensions, so as to have the base currents exactly equated. In this case, the collector current of Q4 would be $$I_O = K \sqrt{P_{diss}\left(1 - \frac{V_{be}}{V_{ds}}\right)} \cong K\sqrt{P_{diss}} \qquad (9)$$

Figure 3:
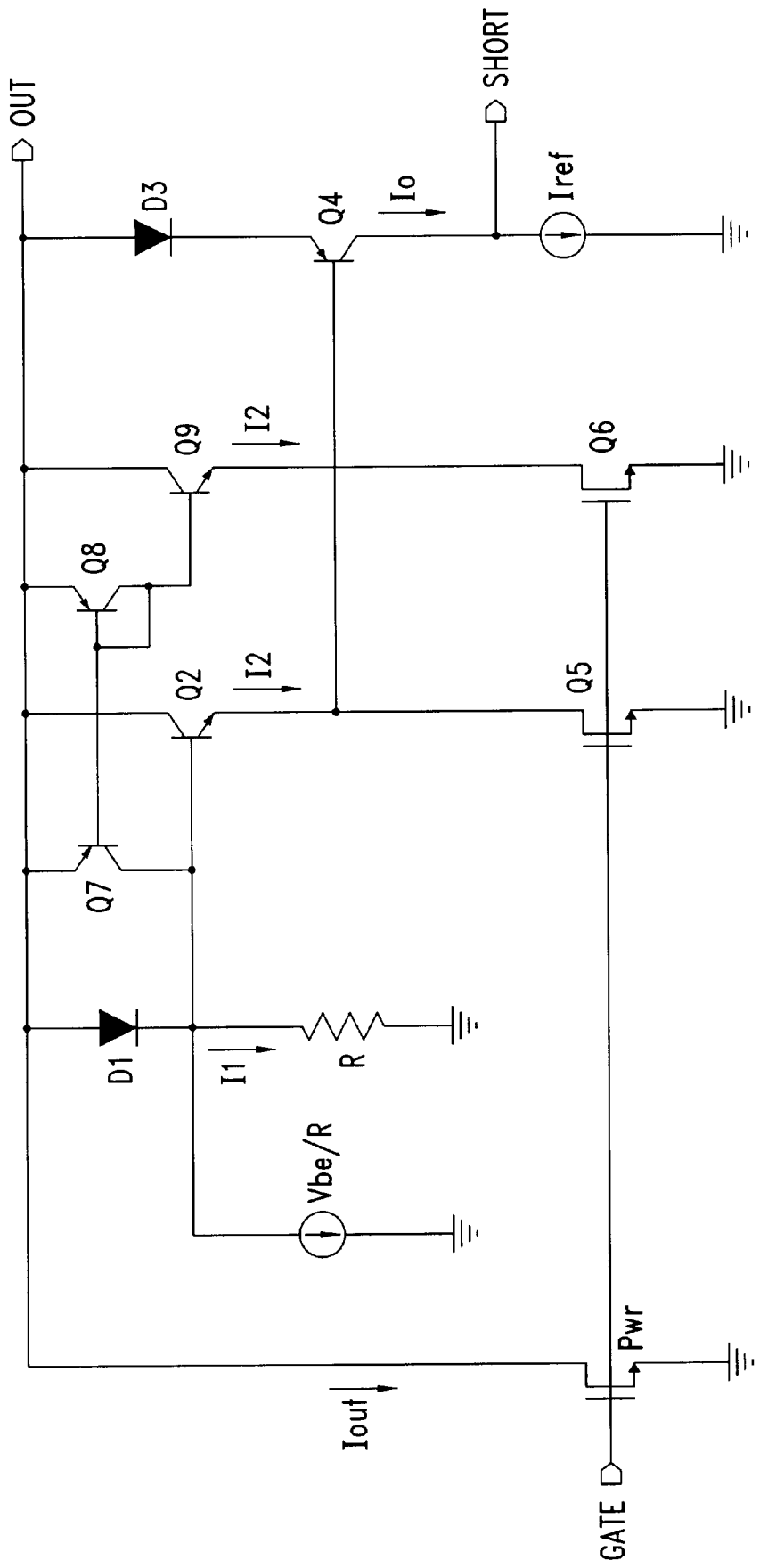

FIG. 3 shows how the voltage drop across the diode D1 can be recovered in order to obtain an accurate measurement of the power dissipated by the power transistor, even at low values of Vds. The additional current generator in parallel with resistor R should generate a current equal to the voltage across the diode divided by the value of the resistor R, i.e. the same as is used to sense the voltage Vds.

The embodiments of the present invention shown in FIGS. 1–3 advantageously provide an accurate measurement of the instantaneous power dissipated by the power transistor, while requiring only a simple circuit and a minimal use of silicon area, especially when the configuration shown in FIG. 1 is used. Furthermore, temperature-wise performance is tied to only a minimal number of parameters by suitably coupling transistor Q5 to the power transistor. In this situation, the only dependence on temperature will come from variations in the resistance of resistor R, which can be arranged to have a low temperature coefficient by using, for example, a polycrystalline silicon resistor.

FIG. 4 shows the power final stage of an audio amplifier comprising two MOS power transistors, both of the N-channel type, which are configured for push-pull operation. A pair of sensors according to the embodiments disclosed in FIGS. 1–3 allow them to be protected without restricting their dynamic range.

According to a disclosed class of innovative embodiments, there is provided: a sensor circuit, comprising: a control terminal connected to a power transistor to receive a drive signal; a first transistor connected to mirror the current of the power transistor and to drive a control terminal of a second transistor with the mirrored current of the power transistor; a current generator connected to drive said control terminal of said second transistor with the current of said current generator; and a sensor output terminal connected to receive the current of said second transistor and the current of a reference current generator, said second transistor having first and second current-carrying terminals thereof, one of said current-carrying terminals operatively connected to a power output connection, the other of said current-carrying terminals thereof connected to a power supply connection through said reference current generator.

According to another disclosed class of innovative embodiments, there is provided: a sensor circuit, comprising: a power transistor having first and second current-carrying terminals thereof connected to first and second current-carrying connections respectively, wherein one of said current-carrying connections is a power supply connection and the other of said current-carrying connections is a power output connection; said power transistor also having a control terminal thereof connected to receive a drive signal; a first transistor, implemented in the same technology as said power transistor, and having a first current-carrying terminal thereof operatively connected to a control terminal of a second transistor, a second current-carrying terminal thereof operatively connected to said power supply connection, and a control terminal thereof connected in common with said control terminal of said power transistor in a current mirror relationship; and a first current mirror circuit connected to be driven by a reference current and to correspondingly drive said control terminal of said second transistor with the mirrored said reference current; said second transistor having first and second current-carrying terminals thereof, said first current-carrying terminal of said second transistor being operatively connected to said power output connection, said second current-carrying terminal of said second transistor being operatively connected to a sensor output terminal and to said power supply connection through a reference current generator.

According to another disclosed class of innovative embodiments, there is provided: a sensor circuit, comprising: a power field-effect transistor having a drain terminal thereof connected to a power output connection, a source terminal thereof connected to a power supply connection, and a control terminal thereof connected to receive a drive signal; a second field-effect transistor having a drain terminal thereof connected to a base terminal of a first bipolar transistor, a source terminal thereof connected to said power supply connection, and a control terminal thereof connected in common with said control terminal of said power transistor in a current mirror relationship; and a first current mirror circuit connected to be driven by a reference current and to correspondingly drive said base terminal of said first bipolar transistor with the mirrored said reference current; said first bipolar transistor having an emitter terminal thereof operatively connected to said power output connection, and a collector terminal thereof connected to a sensor output terminal and to said power supply connection through a reference current generator.

According to another disclosed class of innovative embodiments, there is provided: a sensor circuit, comprising: a power transistor having a drain terminal thereof connected to a power output connection, a source terminal thereof connected to a power supply connection, and a control terminal thereof connected to receive a drive signal; a first transistor having a drain terminal thereof connected to a base terminal of a second transistor, a source terminal thereof connected to said power supply connection, and a control terminal thereof connected in common with said control terminal of said power transistor in a current mirror relationship; a first current mirror circuit connected to be driven by a reference current and to correspondingly drive said base terminal of said second transistor with the mirrored said reference current; said second transistor having an emitter terminal thereof operatively connected to said power output connection, and a collector terminal thereof connected to a sensor output terminal and to said power supply connection through a reference current generator; a third transistor having a drain terminal thereof operatively connected to said power output connection, a source terminal thereof operatively connected to said power supply connection, and a control terminal thereof operatively connected to said control terminal of said first transistor; a second current mirror circuit operatively connected to said first current mirror circuit and to said power supply connection through said third transistor; and a second current generator operatively connected between said first current mirror circuit and said power supply connection.

According to another disclosed class of innovative embodiments, there is provided: a power final stage of an audio amplifier, comprising: first and second sensor circuits, each of said circuits comprising a power transistor having a control terminal thereof connected to receive a drive signal, a first transistor having a drain terminal thereof connected to a base terminal of a second transistor, and a control terminal thereof connected in common with said control terminal of said power transistor in a current mirror relationship, and a first current mirror circuit connected to be driven by a reference current and to correspondingly drive said base terminal of said second transistor with the mirrored said reference current; said second transistor having a collector terminal thereof connected to a power supply connection through a reference current generator and to a sensor output terminal; said power transistor having a drain terminal thereof operatively connected to an emitter terminal of said second transistor through a diode; wherein a source terminal of said power transistor of said first sensor circuit is operatively connected to a power output connection and to a drain terminal of said power transistor of said second sensor circuit.

According to another disclosed class of innovative embodiments, there is provided: a method of sensing the instantaneous power which is dissipated through a power transistor, comprising the steps of: driving said power transistor using a drive signal, said power transistor having a drain terminal thereof connected to a power output connection, a source terminal thereof connected to a power supply connection, and a control terminal thereof connected to receive said drive signal; mirroring the current through said power transistor using a first transistor, said first transistor having a drain terminal thereof connected to a base terminal of a second transistor, a source terminal thereof connected to said power supply connection, and a control terminal thereof connected to said control terminal of said power transistor; driving a first current mirror circuit using a reference current, said current mirror circuit having a first diode operatively connected to said power output connection and to said power supply connection through a resistor, and a third transistor having a collector terminal thereof operatively connected to said power output connection and an emitter terminal thereof operatively connected to said base terminal of said second transistor; applying said reference current and the current of said second transistor to said base terminal of said second transistor, said second transistor having an emitter terminal operatively connected to said power output connection through a second diode, and a collector terminal operatively connected to a sensor output terminal and to said power supply connection through a reference current generator; and outputting the current of said second transistor and the current of said reference current generator through said sensor output terminal.

According to another disclosed class of innovative embodiments, there is provided: a sensing circuit for sensing the instantaneous power which is dissipated through a power transistor in an integrated circuit, having a first terminal which is coupled to a potential reference, a second terminal which forms an output terminal of a power stage, and a control terminal which is coupled to a circuit means for controlling and biasing the stage, characterized in that it comprises first and second transistors, each having first and second terminals and a control terminal, and a current mirror circuit having a first leg which includes a resistive element and is connected between said output terminal of the stage and the potential reference, and a second leg connected between said output terminal and a circuit node to which the control terminal of the first transistor is connected, the first terminal of the first transistor being coupled to said output terminal of the stage through a diode and the second terminal thereof being connected to the potential reference through a current generator as well as to a terminal for connection to the stage control and bias circuit means, and the second transistor having its first and second terminals connected between the potential reference and said circuit node and its control terminal connected to the control terminal of the power transistor.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, a P-channel MOS power transistor could be substituted for the N-channel MOS transistor of the upper half-stage in the diagram of FIG. 4, with a PNP bipolar transistor and an NPN transistor being used for the transistors Q'2 and Q'4, respectively, and exchanging the diode D'1 with the resistor R.

What is claimed is:
1. A sensor circuit comprising:
   a power transistor having a first terminal connected to a power output connection and a control terminal connected to receive a drive signal;
   a first transistor connected to mirror the current of the power transistor and to drive a control terminal of a second transistor with the mirrored current of the power transistor;
   a current generator connected to drive said control terminal of said second transistor with the current of said current generator; and
   a sensor output terminal connected to an output terminal of the second transistor to receive the current of said second transistor and the current of a reference current generator, said second transistor having first and second current-carrying terminals thereof, one of said current-carrying terminals operatively connected to the power output connection, the other of said current-carrying terminals thereof connected to a power supply connection through said reference current generator.

2. The sensor circuit of claim 1, wherein said second transistor is a bipolar transistor of the PNP type.

3. The sensor circuit of claim 1, wherein said second transistor is connected to said power output connection through a diode and said sensor output terminal is connected to the output terminal that is connected to a power supply through the reference circuit generator.

4. The sensor circuit of claim 1, wherein said power transistor is a N-channel MOS transistor.

5. The sensor circuit of claim 1, wherein said power transistor and said first transistor are implemented in the same technology.

6. The sensor circuit of claim 1, wherein said first transistor is a N-channel MOS transistor.

7. The sensor circuit of claim 1, wherein said first transistor has a size substantially smaller than said power transistor, said first transistor being integrated in tight thermal connection to said power transistor.

8. A sensor circuit, comprising:
   a control terminal connected to a power transistor to receive a drive signal;
   a first transistor connected to mirror the current of the power transistor and to drive a control terminal of a second transistor with the mirrored current of the power transistor;

a current generator connected to drive said control terminal of said second transistor with the current of said current generator, said current generator including a diode connected between a power output connection and a power supply connection through a resistor;

a sensor output terminal connected to receive the current of said second transistor and the current of a reference current generator, said second transistor having first and second current-carrying terminals thereof, one of said current-carrying terminals operatively connected to said power output connection the other of said current-carrying terminals thereof connected to said power supply connection through said reference current generator; and a third transistor having its collector connected to said power output connection, its emitter connected to the base of said second transistor, and its base connected between said diode and said resistor.

9. The sensor circuit of claim 8 wherein said resistor is a polycrystalline silicon resistor.

10. A sensor circuit, comprising:

a power transistor having first and second current-carrying terminals thereof connected to first and second current-carrying connections respectively, wherein one of said current-carrying connections is a power supply connection and the other of said current-carrying connections is a power output connection; said power transistor also having a control terminal thereof connected to receive a drive signal;

a first transistor, implemented in the same technology as said power transistor, and having
 a first current-carrying terminal thereof operatively connected to a control terminal of a second transistor,
 a second current-carrying terminal thereof operatively connected to said power supply connection, and
 a control terminal thereof connected in common with said control terminal of said power transistor in a current mirror relationship; and a first current mirror circuit connected to be driven by a reference current and to correspondingly drive said control terminal of said second transistor with the mirrored said reference current; said second transistor having first and second current-carrying terminals thereof, said first current-carrying terminal of said second transistor being operatively connected to said power output connection, said second current-carrying terminal of said second transistor being operatively connected to a sensor output terminal and to said power supply connection through a reference current generator.

11. The sensor circuit of claim 10, wherein said second transistor is a bipolar transistor of the PNP type.

12. The sensor circuit of claim 10, wherein said second transistor is connected to said power output connection through a diode.

13. The sensor circuit of claim 10, wherein said power transistor is a N-channel MOS transistor.

14. The sensor circuit of claim 10, further comprising a second current mirror circuit connected between said first current mirror circuit and said power supply connection.

15. The sensor circuit of claim 10, wherein said first current mirror circuit comprises a diode connected between said power output connection and said power supply connection through a resistor; and a third transistor having its collector connected to said power output connection, its emitter connected to the base of said second transistor, and its base connected between said diode and said resistor.

16. The sensor circuit of claim 15 wherein said resistor is a polycrystalline silicon resistor.

17. The sensor circuit of claim 10, wherein said first transistor is a N-channel MOS transistor.

18. The sensor circuit of claim 10, wherein said first transistor has a size substantially smaller than said power transistor, said first transistor being integrated in tight thermal connection to said power transistor.

19. A sensor circuit, comprising:

a power transistor having a drain terminal thereof connected to a power output connection, a source terminal thereof connected to a power supply connection, and a control terminal thereof connected to receive a drive signal;

a first transistor having a drain terminal thereof connected to a base terminal of a second transistor, a source terminal thereof connected to said power supply connection, and a control terminal thereof connected in common with said control terminal of said power transistor in a current mirror relationship;

a first current mirror circuit connected to be driven by a reference current and to correspondingly drive said base terminal of said second transistor with the mirrored said reference current; said second transistor having an emitter terminal thereof operatively connected to said power output connection, and a collector terminal thereof connected to a sensor output terminal and to said power supply connection through a reference current generator;

a third transistor having a drain terminal thereof operatively connected to said power output connection, a source terminal thereof operatively connected to said power supply connection, and a control terminal thereof operatively connected to said control terminal of said first transistor;

a second current mirror circuit operatively connected to said first current mirror circuit and to said power supply connection through said third transistor; and a second current generator operatively connected between said first current mirror circuit and said power supply connection.

20. The sensor circuit of claim 19, wherein said second transistor is a bipolar transistor of the PNP type.

21. The sensor circuit of claim 19, wherein said second transistor is connected to said power output connection through a diode.

22. The sensor circuit of claim 19, wherein said power transistor is a N-channel MOS transistor.

23. The sensor circuit of claim 19, wherein said power transistor and said first transistor are implemented in the same technology.

24. The sensor circuit of claim 19, wherein said first current mirror circuit comprises a diode connected between said power output connection and said power supply connection through a resistor; and a fourth transistor having its collector connected to said power output connection, its emitter connected to said base terminal of said second transistor, and its base connected between said diode and said resistor.

25. The sensor circuit of claim 24 wherein said resistor is a polycrystalline silicon resistor.

26. The sensor circuit of claim 19, wherein said first transistor is a N-channel MOS transistor.

27. The sensor circuit of claim 19, wherein said first transistor has a size substantially smaller than said power transistor, said first transistor being integrated in tight thermal connection to said power transistor.

28. The sensor circuit of claim 19, wherein said third transistor is a N-channel MOS transistor.

29. The sensor circuit of claim 19, wherein said third transistor is identical to said second transistor.

30. The sensor circuit of claim 19, wherein the drain of said third transistor is connected to said power output connection through a fourth transistor.

31. The sensor circuit of claim 19, wherein said second current mirror circuit comprises fourth and fifth transistors having their base terminals connected together, and their emitter terminals connected to said power output connection, said fourth transistor having its collector terminal connected to said first current mirror, said fifth transistor having its base terminal connected to its collector terminal and to the base of a sixth transistor, said sixth transistor having its collector terminal connected to said power output connection and its emitter terminal connected to the drain of said third transistor.

32. A power final stage of an audio amplifier, comprising:
first and second sensor circuits, each of said circuits comprising
a power transistor having a control terminal thereof connected to receive a drive signal,
a first transistor having a drain terminal thereof connected to a base terminal of a second transistor, and a control terminal thereof connected in common with said control terminal of said power transistor in a current mirror relationship, and
a first current mirror circuit connected to be driven by a reference current and to correspondingly drive said base terminal of said second transistor with the mirrored said reference current; said second transistor having a collector terminal thereof connected to a power supply connection through a reference current generator and to a sensor output terminal; said power transistor having a drain terminal thereof operatively connected to an emitter terminal of said second transistor through a diode;
wherein a source terminal of said power transistor of said first sensor circuit is operatively connected to a power output connection and to a drain terminal of said power transistor of said second sensor circuit.

33. The sensor circuit of claim 32, wherein each of said second transistors are bipolar transistors of the PNP type.

34. The sensor circuit of claim 32, wherein each of said power transistors are N-channel MOS transistors.

35. The sensor circuit of claim 32, wherein each of said power transistors are implemented in the same technology as each of their respective said first transistor.

36. The sensor circuit of claim 32, wherein said sensor circuits further comprise a second current mirror circuit connected between said first current mirror circuit and said power supply connection.

37. The sensor circuit of claim 32, wherein said first current mirror circuit of said second sensor circuit comprise a diode connected between said power output connection and said power supply connection through a resistor; and a third transistor having its collector connected to said power output connection, its emitter connected to the base of said second transistor, and its base connected between said diode and said resistor.

38. The sensor circuit of claim 37 wherein each of said resistors are polycrystalline silicon resistors.

39. The sensor circuit of claim 32, wherein each of said first transistors are N-channel MOS transistors.

40. The sensor circuit of claim 32, wherein each of said first transistors has a size substantially smaller than each of their respective said power transistors, each of said first transistors being integrated in tight thermal connection to each of their respective said power transistors.

41. A method of sensing the instantaneous power which is dissipated through a power transistor, comprising the steps of:
(a.) driving said power transistor using a drive signal, said power transistor having a drain terminal thereof connected to a power output connection, a source terminal thereof connected to a power supply connection, and a control terminal thereof connected to receive said drive signal;
(b.) mirroring the current through said power transistor using a first transistor, said first transistor having a drain terminal thereof connected to a base terminal of a second transistor, a source terminal thereof connected to said power supply connection, and a control terminal thereof connected to said control terminal of said power transistor;
(c.) driving a first current mirror circuit using a reference current, said current mirror circuit having a first diode operatively connected to said power output connection and to said power supply connection through a resistor, and a third transistor having a collector terminal thereof operatively connected to said power output connection and an emitter terminal thereof operatively connected to said base terminal of said second transistor;
(d.) applying said reference current and the current of said second transistor to said base terminal of said second transistor, said second transistor having an emitter terminal operatively connected to said power output connection through a second diode, and a collector terminal operatively connected to a sensor output terminal and to said power supply connection through a reference current generator; and
(e.) outputting the current of said second transistor and the current of said reference current generator through said sensor output terminal.

42. The method of claim 41, wherein said second transistor is a bipolar transistor of the PNP type.

43. The method of claim 41, wherein said power transistor is a N-channel MOS transistor.

44. The method of claim 41, wherein said power transistor and said first transistor are implemented in the same technology.

45. The method of claim 41, further comprising the step, after said step (c.), driving a second current mirror circuit connected between said first current mirror circuit and said power supply connection.

46. The method of claim 41, wherein said resistor is a polycrystalline silicon resistor.

47. The method of claim 41, wherein said first transistor is a N-channel MOS transistor.

48. The method of claim 41, wherein said first transistor has a size substantially smaller than said power transistor, said first transistor being integrated in tight thermal connection to said power transistor.

49. The method of claim 41, wherein said third transistor is a bipolar transistor of the NPN type.

* * * * *